United States Patent [19]
Farag

[11] Patent Number: 6,111,531
[45] Date of Patent: *Aug. 29, 2000

[54] PARALLEL ARCHITECTURE FOR A BANDPASS SIGMA-DELTA MODULATOR

[75] Inventor: Emad N. Farag, Waterloo, Canada

[73] Assignee: Lucent Technologies, Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/866,585

[22] Filed: May 30, 1997

[51] Int. Cl.$^7$ .................................................. H03M 3/00

[52] U.S. Cl. .......................................................... 341/143

[58] Field of Search ..................... 341/143, 155, 341/118, 120, 145; 375/25, 26

[56] References Cited

U.S. PATENT DOCUMENTS

| | | | |
|---|---|---|---|
| 5,084,702 | 1/1992 | Ribner | 341/143 |
| 5,148,166 | 9/1992 | Ribner | 341/143 |
| 5,323,158 | 6/1994 | Ferguson | 341/143 |
| 5,341,136 | 8/1994 | Przybysz et al. | 341/133 |
| 5,408,235 | 4/1995 | Doyle et al. | 341/143 |
| 5,442,353 | 8/1995 | Spence | 341/143 |
| 5,500,645 | 3/1996 | Ribner et al. | 341/143 |
| 5,534,827 | 7/1996 | Yamaji | 332/103 |
| 5,585,801 | 12/1996 | Thurston | 341/143 |

OTHER PUBLICATIONS

J.C. Candy, B.A. Wooley, and O.J. Benjamin, "A voiceband codec with digital filtering," *IEEE Transactions on Communications*, vol. COM–29, pp. 815–830, Jun. 1981.

R. Schrier and M. Snelgrove, "Bandpass sigma–delta modulation," *Electronics Letter*, vol. 25, pp. 1560–1561, Nov. 1989.

M. Rebeschini, N.R.V. Bavel, P. Raker, R. Greene, J. Caldwell, and J.R. Haug, "A 16–b 160–kHz CMOS A/D converter using sigma–delta modulation," *IEEE Journal of Solid State Circuits*, vol. 25, pp. 431–440, Apr. 1990.

L. Longo and B.–R. Horng, "A 15b 80kHz bandpass sigma–delta modulator," in *IEEE International Solid–State Circuits Conference*, pp. 226–227, Feb. 1993.

R. Khoini–Poorfard, L. Lim, D. Johns, "Time–interleaved oversampling convertors," *Electronics Letters*, pp. 1673–1674, Sep. 16, 1993.

S.A. Jantzi, W.M. Snelgrove, and P.F. Ferguson, "A fourth–order bandpass sigma–delta modulator," *IEEE Journal of Solid State Circuits*, vol. 28, pp. 282–291, Mar. 1993.

H. Meyr and R. Subramanian, "Advanced digital receiver principles and technologies for PCS," *IEEE Communications Magazine*, pp. 68–78, Jan. 1995.

F.W. Singor and W.M. Snelgrove, "Switched–capacitor bandpass delta–sigma A/D modulation at 10.7 MHz," *IEEE Journal of Solid State Circuits*, vol. 30, pp. 184–192, Mar. 1995.

P.M. Aziz, H.V. Sorensen, and J.V.D. Spiegel, "An overview of sigma–delta converters," *IEEE Signal Processing Magazine*, pp. 61–84, Jan. 1996.

*Primary Examiner*—Brian K. Young
*Attorney, Agent, or Firm*—Darby & Darby

[57] ABSTRACT

A bandpass sigma-delta modulator includes a first low pass sigma-delta modulator of a predetermined order and operative according to a predetermined transfer characteristic for producing a first output of an initial dynamic range. A second low pass sigma-delta modulator substantially similar to the first low pass sigma-delta modulator is disposed in parallel relationship with the first modulator. Cross-coupled connections between the first and second modulators are operative to alter the respective transfer characteristics such that the first and second low pass modulator outputs cooperate to form the bandpass transfer function and expand the dynamic range beyond that associated with the individual modulators.

22 Claims, 14 Drawing Sheets

PARALLEL ARCHITECTURE FOR A BANDPASS SIGMA-DELTA MODULATOR

FIELD OF THE INVENTION

The invention relates to silicon-based signal processing components, and, more particularly, discrete-time analog signal processing systems of the sigma-delta type.

BACKGROUND OF THE INVENTION

Intricate signal processing of real world analog signals often requires signal conversion into the digital domain. Conversion makes feasible the use of either conventional digital computers or special purpose digital signal processors. Applications for such processing include wireless communications, such as portable voice, data, and messaging systems, that generally employ digital receivers to process transmitted complex high frequency RF signals. Such receivers typically acquire the RF analog signals in the gigahertz frequency range and translate the signals to lower intermediate frequencies, or IFs. Thereafter, the low IF signals are digitized and processed through digital signal processing components and techniques.

In order to initially sample such high frequency signals, however, the sampling rates applied to the analog RF signals are typically extremely high. This often requires the use of extremely high speed sample and hold circuits to conduct the sampling operation.

One technique for achieving high resolution of relatively low frequency signals with lower precision components utilizes oversampling or sigma-delta modulation followed by digital low pass filtering and decimation. Oversampling refers to operation of the modulator at a rate many times above the Nyquist rate, typically twice the bandwidth of the sampled analog signal. Decimation of the signals refers to reduction of the clock rate down to the Nyquist rate. Modulators of the sigma-delta type are often implemented in high resolution applications because of the ability to shape noise away from the sampled signals. Moreover, sigma-delta modulators offer the distinct advantage of multi-bit resolution with a single bit output.

The level of resolution in a sigma-delta modulator, or SDM, typically depends on the "order" of the device. The order is often determined by a somewhat complex transfer function that defines the circuit's frequency response characteristics. For example, a second order SDM typically has substantially better resolution and dynamic range than a first order SDM for the same oversampling ratio. While higher order SDM's are often more desirable to expand the dynamic range, or resolution of the device, a tradeoff usually exists in the form of increased hardware complexity.

Conventional sigma-delta modulation, while somewhat of a mature technology, has primarily focused on low pass architectures that rely on the assumption that the highest frequency component of the input analog signal corresponds to the signal bandwidth. Most low pass SDMs are based on a fundamental architecture comprising a subtractor that takes the difference between an analog signal input and a feedback signal to output a resultant error signal to the input of a feedforward loop filter. The filter generally comprises a discrete time integrator having a transfer function:

$$\frac{Z^{-1}}{1-Z^{-1}}$$

The output of the integrator feeds a quantizer which converts the filtered signal to a voltage corresponding to a mapped digital value. Generally, the quantizer has two output levels, one of which is sampled and fed back to the input subtractor as the feedback signal.

During operation, the circuit provides an oversampled sample stream output with low resolution, typically comprising one bit per sample. Additionally, quantization noise is shaped away from the signal into the higher frequency spectrum. The quantization noise is attenuated by the low pass decimation filter that follows the sigma delta modulator. The low pass decimation filter converts the low resolution oversampled sample stream into a high resolution Nyquist rate (or near Nyquist rate) sample stream. While the fundamental low pass sigma delta modulator architecture is beneficial for its intended purposes, the single integrator and quantizer design tends to be susceptible to instability at higher orders. Moreover, single components realizing higher-order functions tend to operate at slower speeds, substantially affecting the performance of the modulator.

One technique for allegedly improving the stability of low pass SDMs, and operating the components at a lower speed, involves implementing a time-interleaved parallel architecture. The time-interleaved circuit uses two identical, mutually cross-coupled modulators running at a sampling rate $f_s$ to generate the same modulator transfer function, which runs at an equivalent sampling rate of $2f_s$. The architecture includes a single sample and hold circuit operating at a sampling rate $2f_s$. The sampled stream is split into the two branches, with each stream being down-sampled by two. The successive branches are time delayed at the respective inputs by a delay element. The down-sampled inputs feed respective modulator branches in substantially similar fashion to the fundamental low pass modulator described above. However, coupled between the respective branches are cross-coupled connections feeding the inputs of the other branch integrator inputs. The cross-coupled connection directed to the time delayed modulator includes a delay element to compensate for the delay caused at the subtractor input. Following quantization of the respective signals, the respective branch signals are upsampled by a factor of two and combined at a single adder to produce the resultant quantized signal at speed $2f_s$.

While this circuit appears beneficial for its intended low pass purposes, it suffers from the drawback of requiring a relatively high speed sample and hold circuit operating at the overall circuit speed. Moreover, because of the asymmetrical structure of the branches caused by the additional delaying elements for the subsequently split branches, the overall circuit is susceptible to component mismatch effects.

Although low pass sigma delta modulation is an important sigma delta modulation technique, it fails to take advantage of bandpass signal conversion methods. To realize the benefits of bandpass conversion, the fundamental architecture for a bandpass SDM includes an adder having respective inputs for receiving a bandpass analog signal and a quantized feedback signal to produce an error signal output. The output of the adder feeds a feedforward loop filter having a bandpass transfer function characterized by:

$$\frac{Z^{-2}}{1+Z^{-2}}$$

A single quantizer or comparator disposed at the output of the filter converts the filtered signal to an analog voltage corresponding to a digital value. A feedback branch samples the output of the quantizer and directs the sampled output to the adder for summing with the analog input signal.

While this circuit works well for its intended purposes, the single filter and quantizer design tends to be susceptible to instability at higher orders, much like the fundamental low pass architecture. This is made more severe due to the high sampling rates required for the input sample and hold circuit. Moreover, single components realizing higher-order bandpass functions tend to operate at slower speeds, substantially affecting the performance of the modulator.

To minimize stability problems with individual higher-order components, an approach for implementing a bandpass SDM, disclosed in U.S. Pat. Nos. 5,341,136, 5,442,353, and 5,500,645, involves cascading low-order low pass SDMs to realize an overall higher-order bandpass modulator. This design has allegedly proven to reduce stability problems commonly associated with single component high order modulators, yet suffers from the drawback of an overall reduction in speed due to the cascaded configuration.

Therefore, the need exists for a parallel architecture for a bandpass sigma-delta modulator implementing low order components to effect a higher speed analog-to-digital converter. There also exists a need for such a modulator having the capability of operating at relatively high speeds and through a relatively high dynamic range. The sigma-delta modulator of the present invention satisfies these needs.

SUMMARY OF THE INVENTION

The bandpass sigma-delta modulator of my present invention provides a stable parallel architecture for improving the speed of a bandpass sigma-delta modulator by implementing relatively inexpensive and reduced precision lower speed modulators. Moreover, the advantage in speed is realized while maintaining a relatively wide dynamic range for the resultant output signals.

In one form, my invention comprises a single channel bandpass sigma-delta modulator having an overall bandpass transfer function and an overall sampling rate $f_s$ for converting bandpass analog signals into digital signals. The modulator includes a first low pass sigma-delta modulator of a predetermined order and operative according to a predetermined transfer characteristic for producing a first output of an initial dynamic range. A second low pass sigma-delta modulator substantially similar to the first low pass sigma-delta modulator is disposed in parallel relationship with the first modulator. Cross-coupled connections disposed in mutually cross-coupled communication between the first and second modulators are operative to alter the respective transfer characteristics such that the first and second low pass modulator outputs cooperate to form the bandpass transfer function and expand the dynamic range beyond the initial dynamic range.

In another form, my invention comprises a dual channel bandpass sigma-delta modulator having an overall bandpass transfer function and an overall sampling rate $f_s$ for converting bandpass analog signals to digital signals. The modulator includes an in-phase channel for processing in-phase signals and comprising a single channel bandpass sigma-delta modulator operating at a sampling rate of:

$$\frac{f_s}{2}$$

and having a desired channel transfer function. The in-phase channel has a first low pass sigma-delta modulator of a predetermined order and operative according to a predetermined transfer characteristic for producing a first output of an initial dynamic range. A second low pass sigma-delta modulator substantially similar to the first low pass sigma-delta modulator is included in the in-phase channel and disposed in parallel relationship with the first modulator. Cross-coupling connections disposed in mutually cross-coupled communication between the first and second modulators are operative to alter said respective desired transfer characteristics such that the first and second low pass modulator outputs cooperate to define the channel transfer function and expand the dynamic range beyond the initial dynamic range.

The dual channel modulator further includes a quadrature channel disposed in parallel relationship to the in-phase channel and substantially similar to the in-phase channel for processing quadrature bandpass signals.

In yet another form, my invention comprises a method of expanding the dynamic range of a bandpass sigma-delta modulator comprising at least one pair of low pass sigma-delta modulators disposed in parallel relation. The pair of modulators have substantially similar transfer characteristics to cooperatively define an output transfer function defining an initial dynamic range. The method includes the step of cross-coupling the low pass sigma-delta modulators to alter the output transfer function and cooperatively expand the initial dynamic range.

BRIEF DESCRIPTION OF THE DRAWINGS

Other features and advantages of my present invention will be apparent from the following detailed description when read in conjunction with the accompanying drawings, wherein.

DETAILED DESCRIPTION OF THE INVENTION

Designs for radio frequency (RF) digital conversion receivers typically exploit the fact that lowpass in-phase ("I") and quadrature phase ("Q") components are expressible in terms of bandpass samples. To sample and reconstruct a passband signal centered at $f_{BP}$, the sampling rate $f_s$ should meet the criterion:

$$f_s = \frac{4f_c}{2k-1}$$

where:

$f_c$ is the carrier frequency;

k is a positive integer less than $$\frac{f_c}{BW} + 0.5$$

and

BW is the bandpass signal bandwidth.

Figure 1:
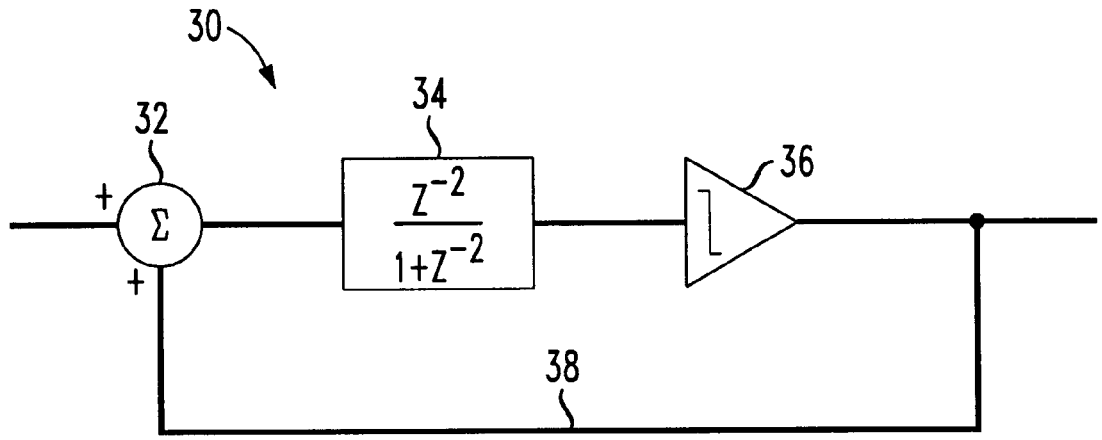
FIG. 1 is a signal diagram of a conventional second order bandpass sigma-delta modulator.

Referring now to FIG. 1, a conventional second order bandpass sigma delta modulator 30 operating within the sampling criteria above includes a summing device 32 to combine an analog input signal and a feedback signal into an error signal. A filter 34 having a bandpass transfer characteristic is connected to the output of the summing device in order to filter the error signal according to the transfer function:

$$\frac{Z^{-2}}{1+Z^{-2}}$$

Disposed at the output of the filter is a quantizer 36 to convert the filter output to a mapped value corresponding to a digital output signal. The output of the quantizer 36 is fed back to the summing device through feedback branch 38.

Theoretically, the input signal samples described above may be divided into four groups; G0, G1, G2, and G3 and expressible as:

G0: $4nT_s$

G1: $(4n+1)T_s$

G2: $(4n+2)T_s$

G3: $(4n+3)T_s$ where:

$T_s$ is the sampling period; and n=0,1,2,3, . . . .

Assuming that the bandpass signal is given by:

$$S_{BP}(t)=I(t) \cos (w_c t)+Q(t) \sin (w_c t)$$

and k=1,3,5, . . . , then the four groups of signals reduce to:

$$G0(n)=I(4nT_s)$$

$$G1(n)=Q((4n+1)T_s)$$

$$G2(n)=-I((4n+2)T_s)$$

$$G3(n)=-Q((4n+3)T_s)$$

If k=2, 4, 6, . . . , then the four groups of signals are given by:

$$G0(n)=I(4nT_s)$$

$$G1(n)=-Q((4n+1)T_s)$$

$$G2(n)=-I((4n+2)T_s)$$

$$G3(n)=Q((4n+3)T_s)$$

In both cases, groups G0 and G2 sample the in-phase channel, while groups G1 and G3 sample the quadrature-phase channel. The division of the samples into four groups makes possible the realization of a circuit that replaces the aforedescribed single-filter/quantizer bandpass SDM with four lowpass SDMs.

Figure 2:
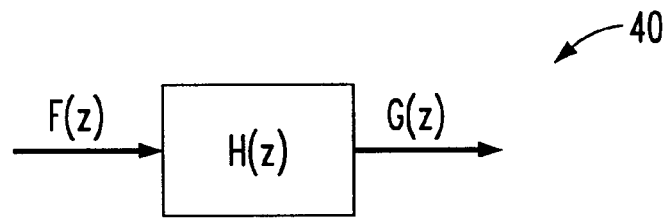
FIG. 2 is a signal diagram of a theoretical linear system.

Referring now to FIG. 2, a linear system 40 is shown with an input F(z), an output G(z), and a transfer characteristic H(z). The system may be conveniently expressed as:

$$G(z)=H(z)F(z)$$

The linear system 40 may be divided up into the sum of two functions, one having even symmetry, and the other having odd symmetry such that:

$$F(z)=F_e(z)+F_o(z)$$

$$G(z)=G_e(z)+G_o(z)$$

$$H(z)=H_e(z)+H_o(z)$$

These expressions may be further modified with the knowledge that the product of any two even functions or odd functions is even, while the product of an even function and an odd one is odd. The modified expressions take the form:

$$G_e(z)=H_e(z)F_e(z)+H_o(z)F_o(z)$$

$$G_o(z)=H_o(z)F_e(z)+H_e(z)F_o(z)$$

Figure 3:
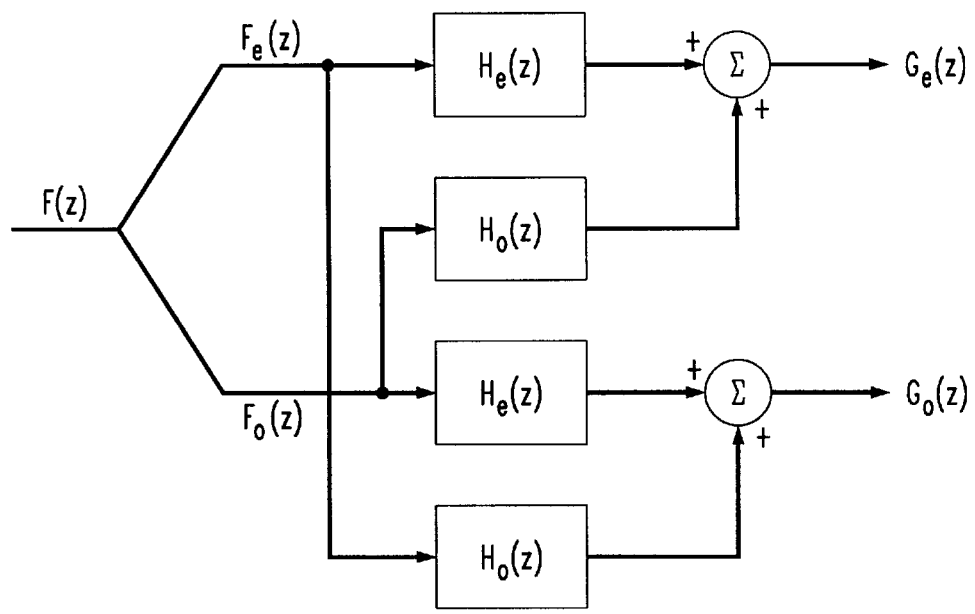
FIG. 3 is a signal diagram of the linear system of FIG. 2 split into even-sample and odd-sample branches.

FIG. 3 illustrates a signal diagram realizing the above expressions.

The above concepts may be applied to a single channel bandpass delta-sigma modulator having a transfer function:

$$H(z) = \frac{Z^{-1}}{1+Z^{-1}}$$

$$= \frac{-Z^{-2}}{1-Z^{-2}} + \frac{Z^{-1}}{1-Z^{-1}}$$

An inspection of the divided transfer function reveals the presence of an even function and an odd function. Further, the two functions are similar with the exception of a delay.

Figure 4:
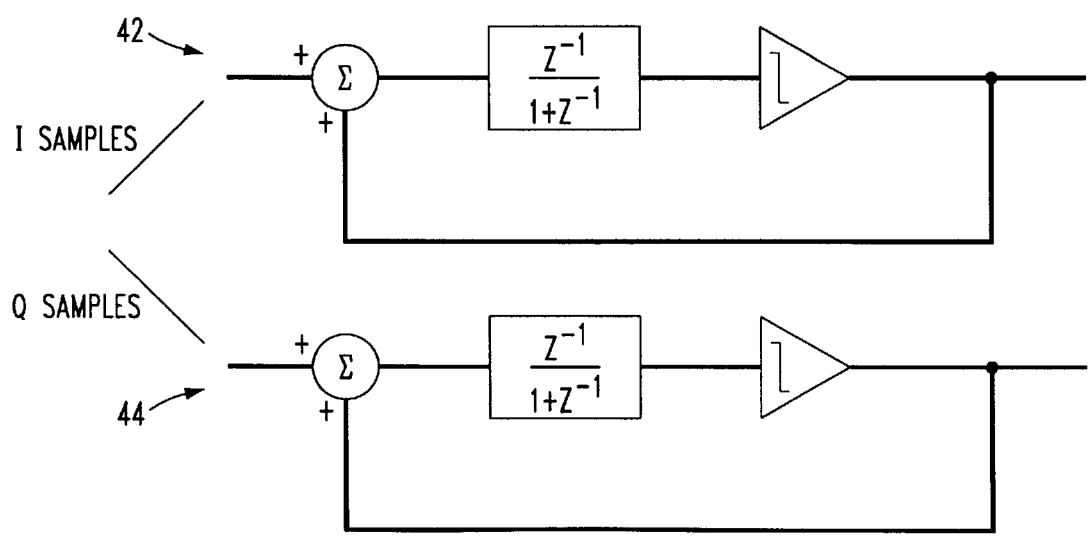
FIG. 4 is a signal diagram of the conventional bandpass sigma-delta modulator split theoretically into lower order parallel branches.

Referring now to FIG. 4, and in light of the theoretical splitting described above, the conventional bandpass sigma-delta modulator 30 may be theoretically divided into an in-phase channel 42 and a quadrature channel 44 that operate in parallel to reduce the speed requirements for the separate branches, yet retain an overall transfer characteristic defined by the original modulator. Additional splitting into parallel branches may be performed to further lower the operating speed of the individual components. Unfortunately, by splitting up the modulator into individual parallel branches without further modifying the architecture, the dynamic range of the system is significantly suppressed. Moreover, the presence of additional components in the unmodified circuit makes the system susceptible to component mismatch.

I have found that by cross-coupling parallel low pass sigma-delta modulators having individual sample and hold circuits, the speed requirements for the individual components may be minimized for a given oversampling ratio while maintaining a relatively high dynamic range.

Figure 5:
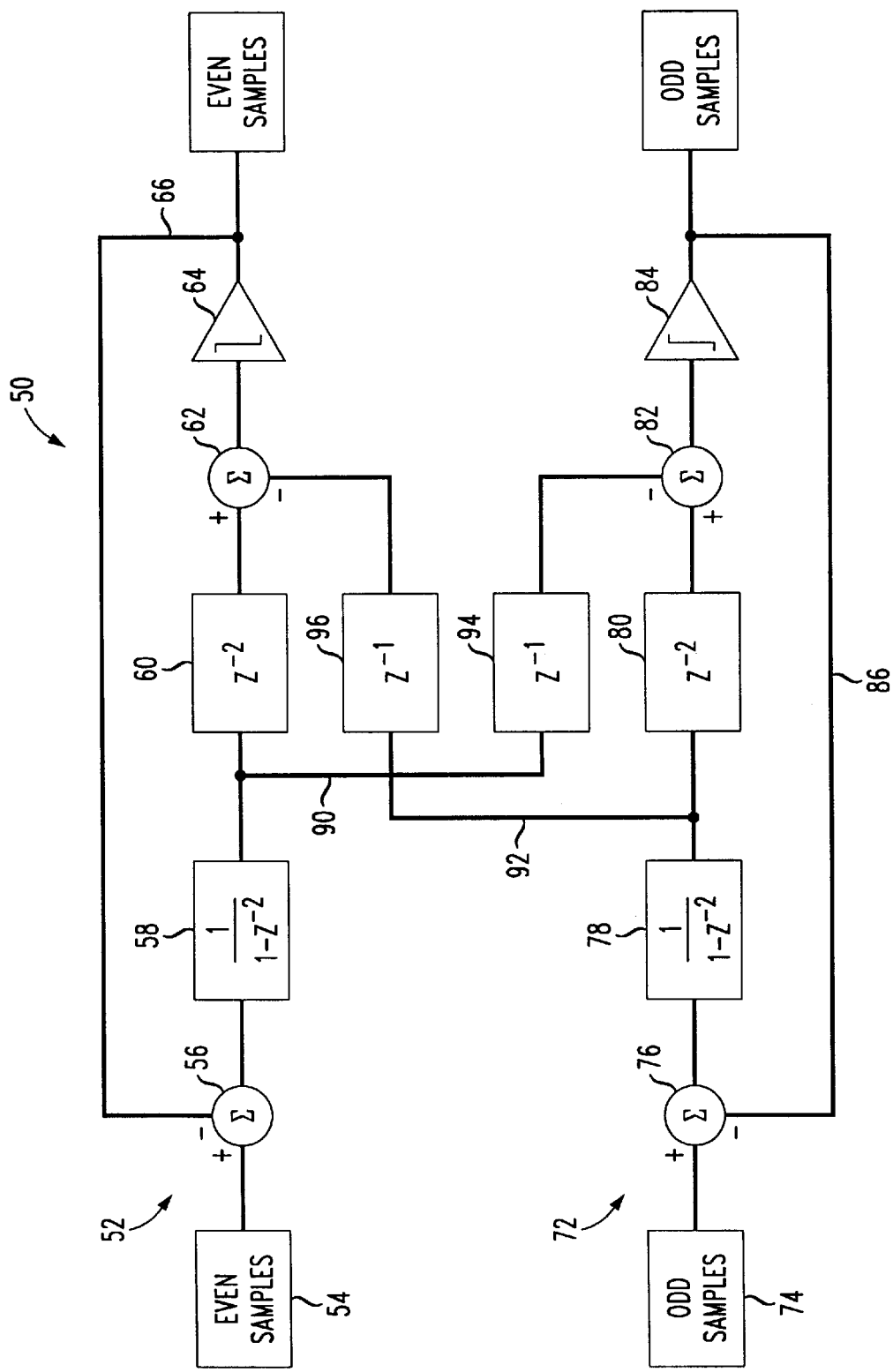
FIG. 5 is a signal diagram of a single channel second order bandpass sigma-delta modulator according to one embodiment of the present invention.

Referring now to FIG. 5, a single channel second order bandpass sigma-delta modulator in accordance with a first embodiment of my present invention, generally designated 50, includes a first low pass sigma-delta modulator 52 and a second low pass sigma-delta modulator 72 and cross-coupling connections 90 and 92 to correlate the two modulators and attain a relatively high dynamic range.

Further referring to FIG. 5, the first low pass sigma-delta modulator 52 comprises a forward path for processing even samples. The even samples are detected by a first sample and hold circuit 54 triggered by the even samples from the in-phase channel. The even samples are fed to a first subtractor 56 having a minuend input for receiving the input analog signal and a subtrahend input for receiving a feedback signal. The output of the subtractor feeds an integrator 58 having a transfer characteristic of approximately:

$$\frac{1}{1-Z^{-2}}$$

Disposed at the integrator output is a delay element 60 with a transfer characteristic $Z^{31\ 2}$ and including an output connected to a second subtractor 62. The second subtractor has an input for receiving the delayed output and an output directed to the input of a quantizer 64 which converts the analog signal to a corresponding digital quantized value. A feedback branch 66 samples the output of the quantizer and feeds back the quantized signal to the first subtractor 56.

The second low pass SDM 72 is disposed in parallel relation to the first low pass SDM for processing odd samples. The odd samples are detected by a second sample and hold circuit 74 (FIG. 5) triggered by the odd samples from the in-phase channel. The odd samples are fed to a forward signal path configured somewhat symmetrical to the first low pass SDM for processing odd samples. The second low pass SDM includes a third subtractor 76 having respective inputs for sampling odd samples from the input analog signal and subtracting a feedback signal equal to samples of the digital output therefrom. The output of the third subtractor feeds a second integrator 78 having a transfer characteristic approximately equal to:

$$\frac{1}{1-Z^{-2}}$$

Disposed at the integrator output is a second delay element 80 with a transfer characteristic $Z^{-2}$ and including an output connected to a fourth subtractor 82. The fourth subtractor has, an input for receiving the delay 80 output and feeds the output to a second quantizer 84 which converts the analog signal to digital form. A second feedback branch 86 samples the digital output of the second quantizer and feeds back the quantized signal to the third subtractor 76.

With continuing reference to FIG. 5, the cross-coupling connections comprise respective first and second branches 90 and 92 having respective delay elements 94 and 96. The first branch 90 is connected to and samples the output of the first integrator 58, and directs the sampled output through the first delay element 94 to the fourth subtractor 82 to alter the overall transfer function of the second low pass SDM 72. Similarly, the second branch 92 is connected to and samples the output of the second integrator 78, and feeds the sampled output through the second delay element 96 and to the second subtractor 62 to alter the overall transfer function of the first low pass SDM 52. The output of the single channel bandpass sigma-delta modulator of the present invention is the negatived output of a conventional single channel bandpass sigma-delta modulator.

During operation, the input analog signal is alternately sampled by the first and second sample and hold circuits 54 and 74 enabling each circuit to operate at half the sampling rate of the overall channel. The altered transfer characteristics of the two low order SDMs, resulting from the cross-coupling connections disposed therebetween, enables the combined even and odd sample output to realize a dynamic range typically associated with double the sample rate of either branch.

Figure 6:
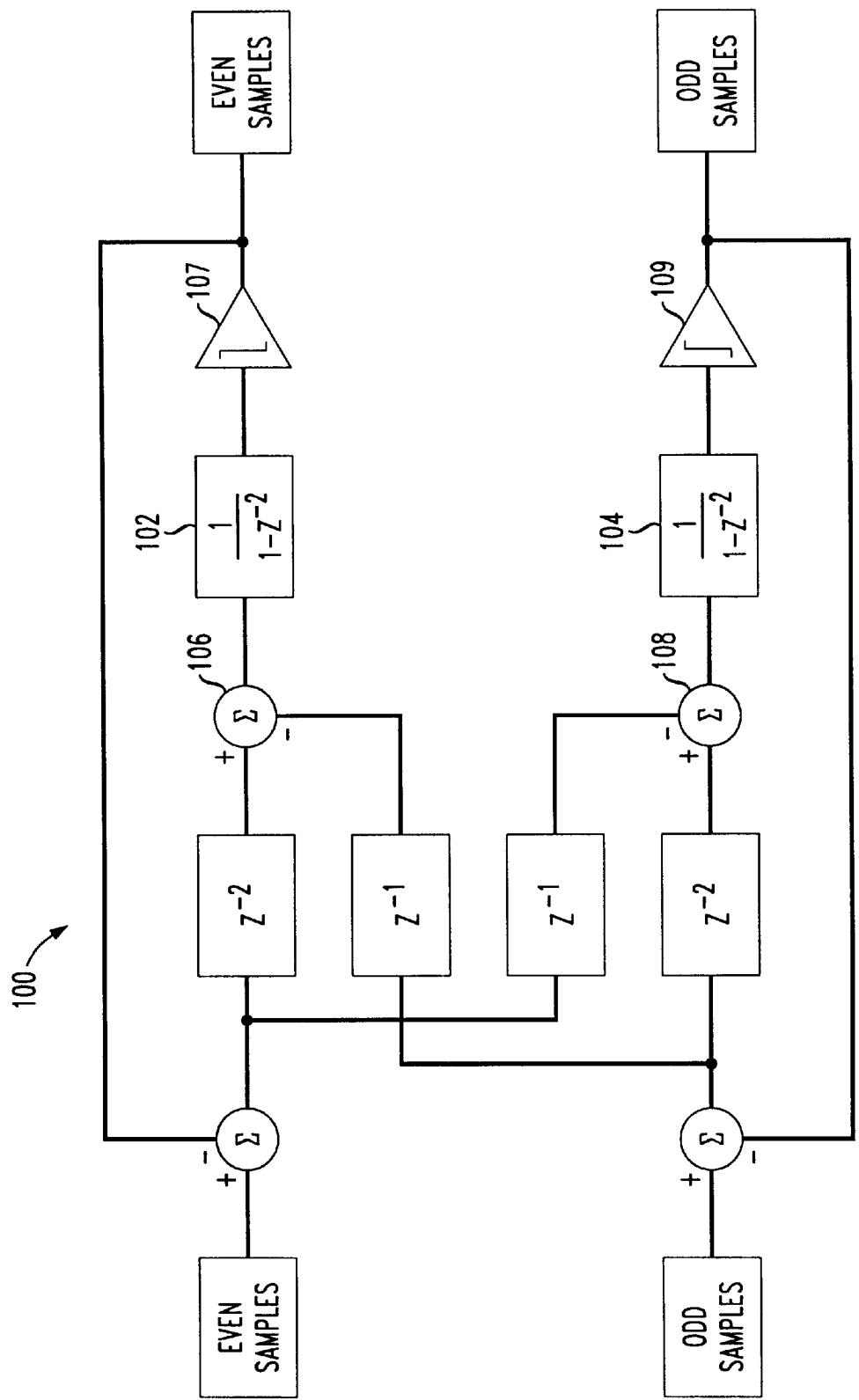
FIG. 6 is a signal diagram of a single channel second order bandpass sigma-delta modulator similar to another embodiment of the present invention.

FIG. 6 illustrates a second embodiment of the single channel second order bandpass SDM, generally designated 100. This configuration is designed substantially similar to the embodiment shown in FIG. 5, but differs theoretically from the first embodiment by the placement of integrator blocks 102 and 104 between respective subtractors 106 and 108 and quantizers 107 and 109. The overall transfer function theoretically matches that of the embodiment of FIG. 5. Yet, I have determined that component mismatch tends to affect the performance of the first embodiment 50 while the effect on the second embodiment 100 is relatively small.

In the previous description regarding the embodiments of the single channel second order bandpass SDMs, both embodiments have substantially the same linearized transfer function as the conventional single channel second order bandpass SDM. However, as indicated above, in the presence of mismatch, the response of each modulator differs.

We can assume any errors occur in the integrator block, which ideally has a transfer function:

$$\frac{1}{1-Z^{-2}}$$

Figure 7:
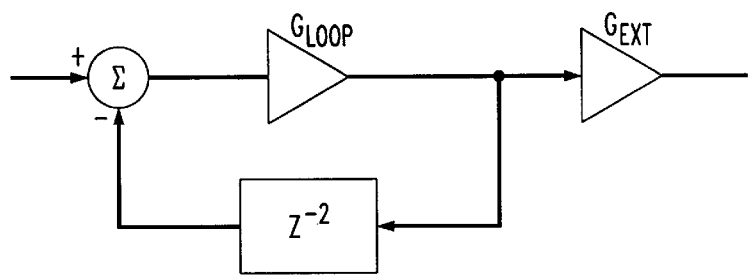
FIG. 7 is a signal diagram of the theoretical mismatch associated with an integrator block according to one embodiment of the present invention.

As shown in FIG. 7, mismatch may be modeled by the elements $G_{LOOP}$ and $G_{EXT}$. Ideally, both elements have a value of 1. Practically, however, $G_{LOOP}$ is typically less than 1, while $G_{EXT}$ is often slightly greater or less than 1. $G_{LOOP}$ comprises the leakage of the integrator, caused by the finite gain A of the operational amplifier in the integrator and may be expressed as:

$$G_{LOOP}=1-1/A$$

The product of $G_{LOOP}G_{EXT}$ is the gain of the integrator.

Figure 8:
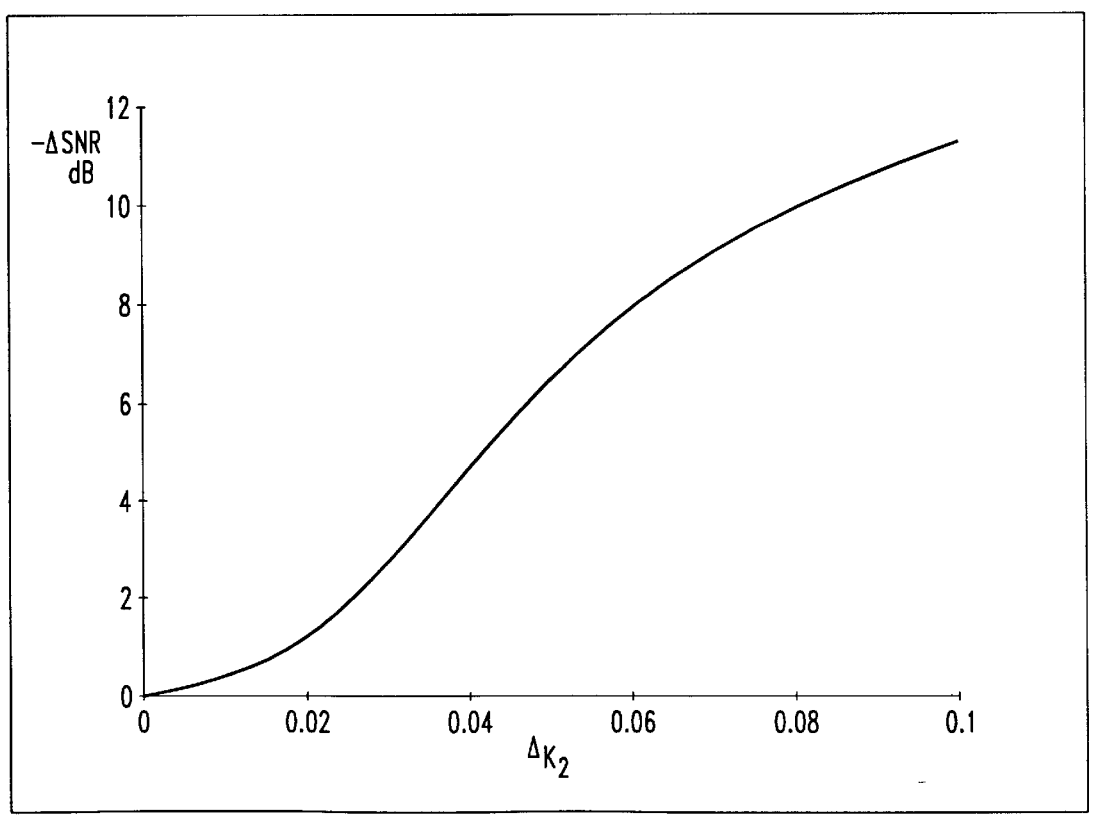
FIG. 8 is a graph of the degradation in SNR due to the effects of $G_{EXT}$ between the even and odd branches of the sigma-delta modulator shown in FIG. 5.

Generally, $G_{EXT}$ has no effect on the performance of the SDM of FIG. 6 because gain doesn't affect the signal's polarity and hence the operation of the comparator. However, this is only true for the embodiment shown in FIG. 5 if $G_{EXT}$ of the even and odd branches are equal. But if there is a discrepancy between them, it would degrade the performance. FIG. 8 illustrates the degradation in signal-to-noise-ratio (SNR) due to discrepancies in the value of $G_{EXT}$ between the even and the odd branches of the SDM given in FIG. 5. For example, a two percent difference in $G_{EXT}$ leads to a 1.5 decibel degradation in SNR.

Figure 9:
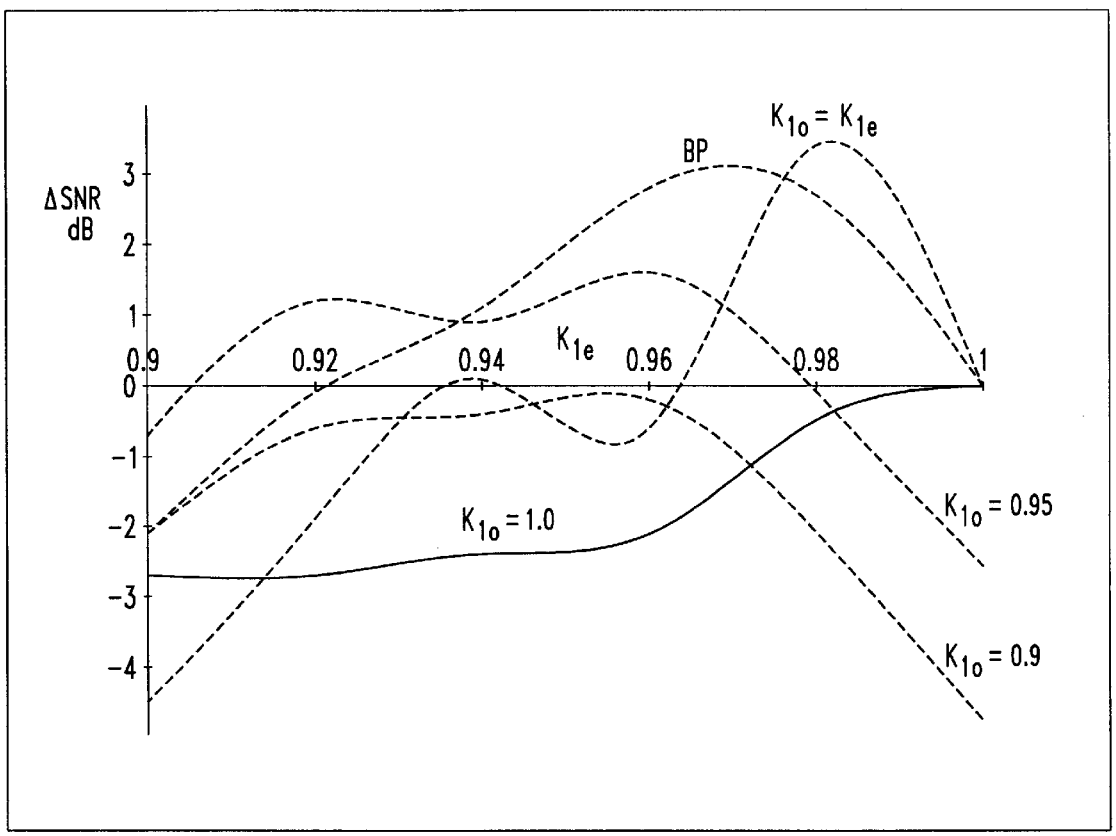
FIG. 9 is a graph of the change in SNR due to mismatch in the value of $G_{LOOP}$ for a conventional single channel bandpass sigma-delta modulator as compared to the bandpass sigma-delta modulator of the present invention illustrated in FIG. 6.

FIG. 9 shows the effect of mismatch and non-unity in $G_{LOOP}$ on the conventional single channel bandpass SDM and the bandpass SDM architecture shown in FIG. 6. Depending upon the architecture, a ten percent degradation in $G_{LOOP}$ could lead up to a 4.5 decibel degradation in SNR.

Figure 10:
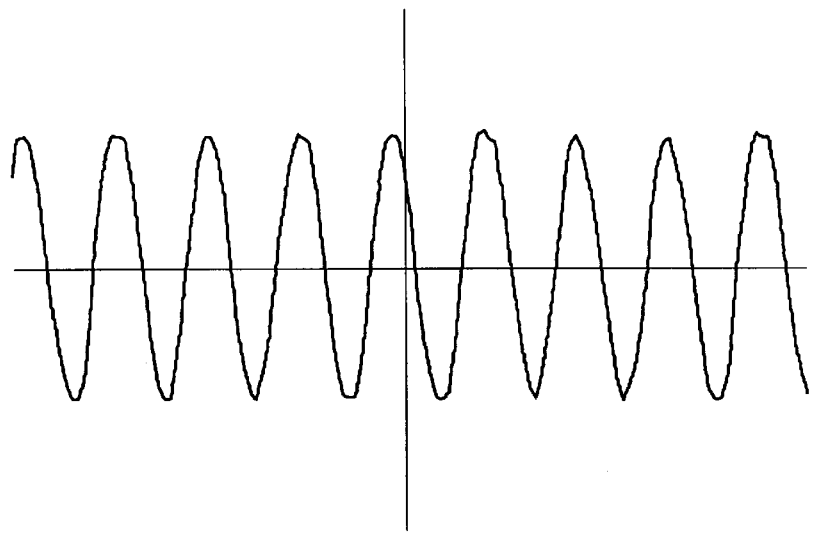
FIG. 10 is a graphical representation of distortion in the output signal of the bandpass sigma-delta modulator of FIG. 5 with $G_{LOOPe}=0.99$ and $G_{LOOPo}=0.95$.
Figure 11:
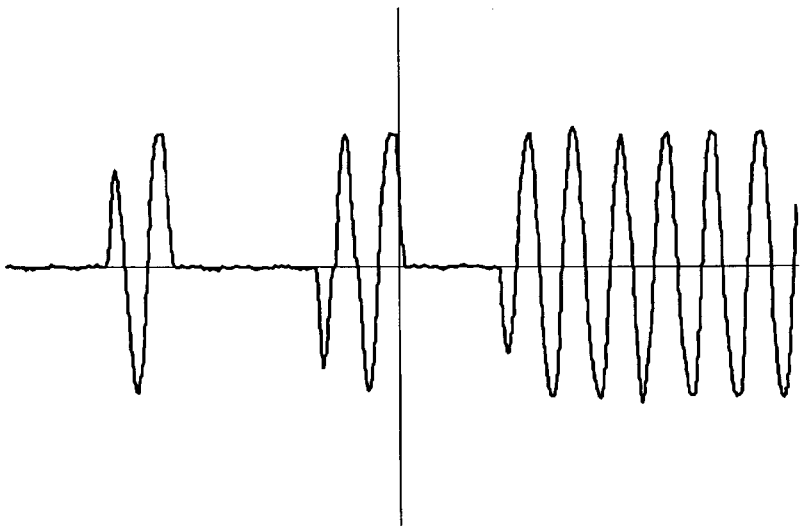
FIG. 11 is a graphical representation of the distortion in the output signal of the bandpass sigma-delta modulator shown in FIG. 5 with $G_{LOOPe}=1.0$ and $G_{LOOPo}=0.95$.

FIGS. 10 and 11 show the effects of distortion of the output signal (sinewave of FIG. 10) resulting from varying values of $G_{LOOP}$ between the even and the odd branches of the bandpass SDM embodiment shown in FIG. 5.

The discussion above shows that mismatch between components can cause the architecture of FIG. 5 to become unstable under certain circumstances which results in unacceptable signal distortion. On the other hand, the effect of mismatch on the architecture illustrated in FIG. 6 is quite small, and comparable to that of the conventional single channel second order bandpass SDM.

Figure 12:
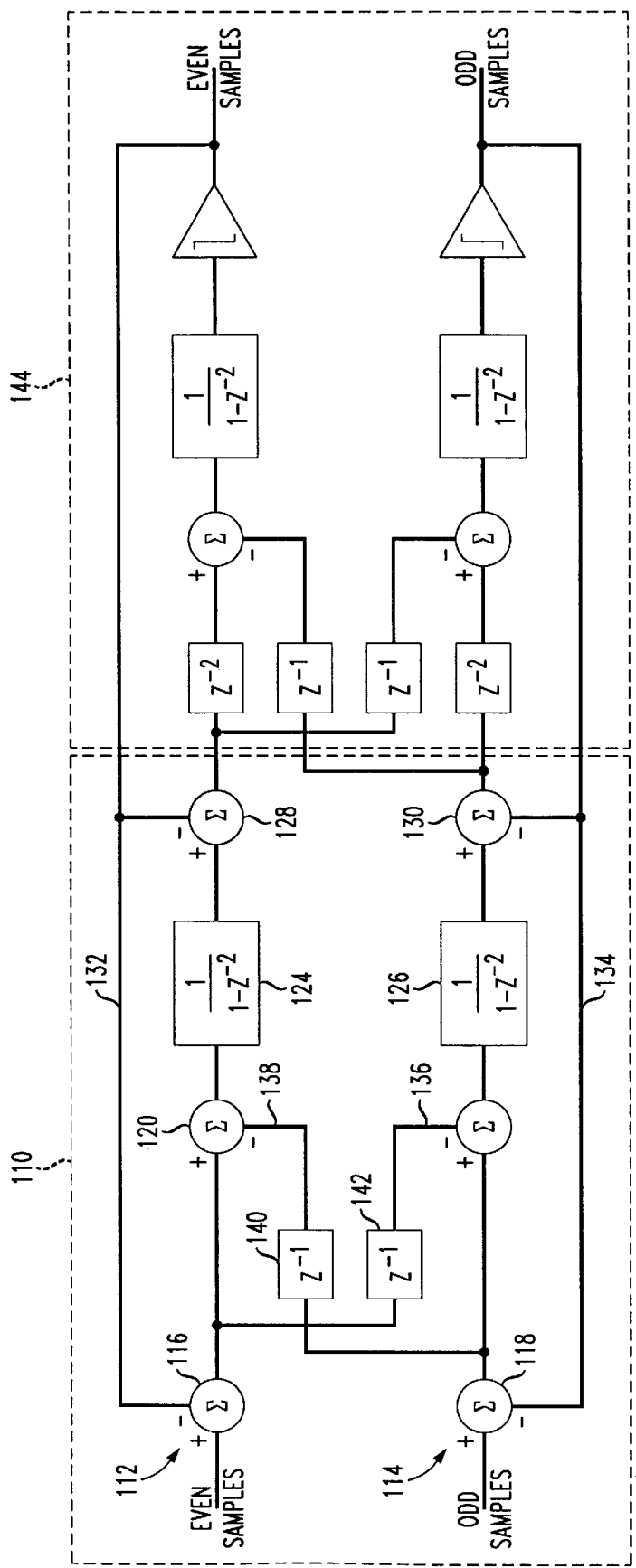
FIG. 12 is a signal diagram of a single channel fourth order bandpass sigma-delta modulator according to one embodiment of the present invention.

Turning now to FIG. 12, the concept of the present invention is readily applicable to higher order bandpass SDMs by cascading multiple stages of cross-coupled low pass SDMs. In the configuration illustrated in FIG. 12, an input stage 110 comprises a pair of parallel low pass SDMs 112 and 114 having respective input subtractors 116 and 118 for feeding sampled analog signals to respective intermediate subtractors 120 and 122. The outputs of the intermediate subtractors are connected to respective integrators 124 and 126 having respective outputs connected to respective output subtractors 128 and 130 of second stage 144. Cross-coupling between the branches of stage 110 is accomplished through respective branches 136 and 138 that sample the respective input subtractor outputs and cross-couple the sampled signals through respective delay elements 142 and 140 to the inputs of the respective intermediate subtractors 122 and 120.

Output stage 144 is cascaded with the input stage 110 and comprises a second order bandpass sigma-delta modulator described hereinabove and illustrated in FIG. 6. The effect of cascading in this manner is an overall transfer function characteristic of a fourth order bandpass sigma-delta modulator.

Similar to the performance analysis described in conjunction with the second order bandpass SDM embodiments, the analysis for the fourth order bandpass SDM shows that placing the integrator after the subtractor significantly reduces the degradation in SNR due to component mismatch. For example, if the gain in the integrator operational amplifier is 34 dB with a 3 dB mismatch, the degradation in the SNR with the integrator after the subtractor is about 1 dB, while the degradation in the SNR with the integrator before the branch splitting is about 30 dB.

The embodiments described above may be realizable through selection of discrete circuit components well known to those skilled in the art. However, an important application of the present invention involves implementation in solid state microelectronic circuits through the use of switched capacitor techniques.

Figure 13:
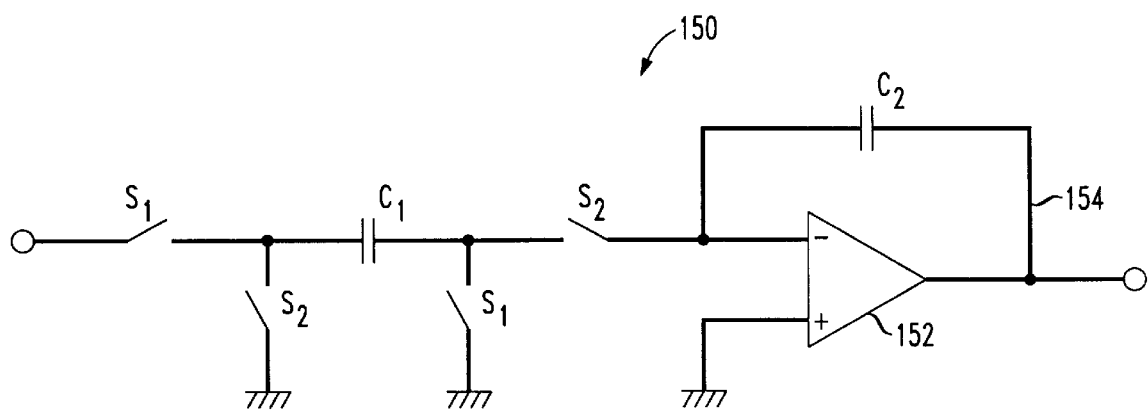
FIG. 13 is a schematic of a switched capacitor integrator.
Figure 14:
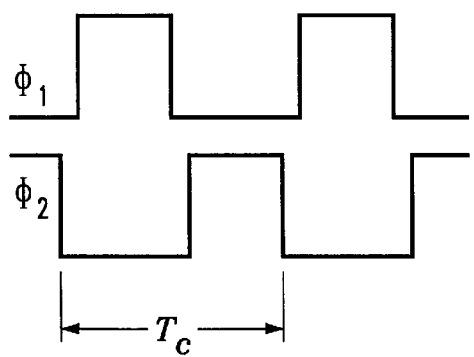
FIG. 14 is a timing diagram for the switches of FIG. 13.

The switched-capacitor filter technique relies on the theory that a capacitor switched between two circuit nodes at a sufficiently high rate is equivalent to a resistor connecting the two nodes. Referring now to FIGS. 13 and 14, the basic building block of a switched capacitor filter comprises an integrator circuit 150 including respective pairs of "normally open" switches S1 and S2 respectively disposed in an input ladder network and connected to the inverting input terminal of an op amp 152. A first pair of switches S1 and S2 are grounded in parallel and separated by a first capacitor C1. A second pair of switches S1 and S2 are respectively disposed at the input and output of the capacitor C1. A second capacitor C2 is shunted across the op amp output and the inverting input terminal to define a negative feedback loop 154.

The pairs of switches S1 and S2 are driven by a nonoverlapping two-phase clock (FIG. 14), with changes in state to the S1 switches occurring during the $\Phi_1$ pulses, and switching of S2 occurring during the $\Phi_2$ pulses. It follows that during $\Phi_1$, switches S1 close to charge C1 up to the input voltage. Then during $\Phi_2$, which occurs a half cycle after $\Phi_1$, switches S2 connect C1 to the virtual-ground input of the op amp 152 where it discharges to charge C2. Those skilled in the art will recognize that the time constant of the integrator block 150 is proportional to the clock period T and the capacitor ratio C2/C1. These relationships are highly controllable in silicon device processing, especially in integrated circuit processing techniques.

Figure 15:
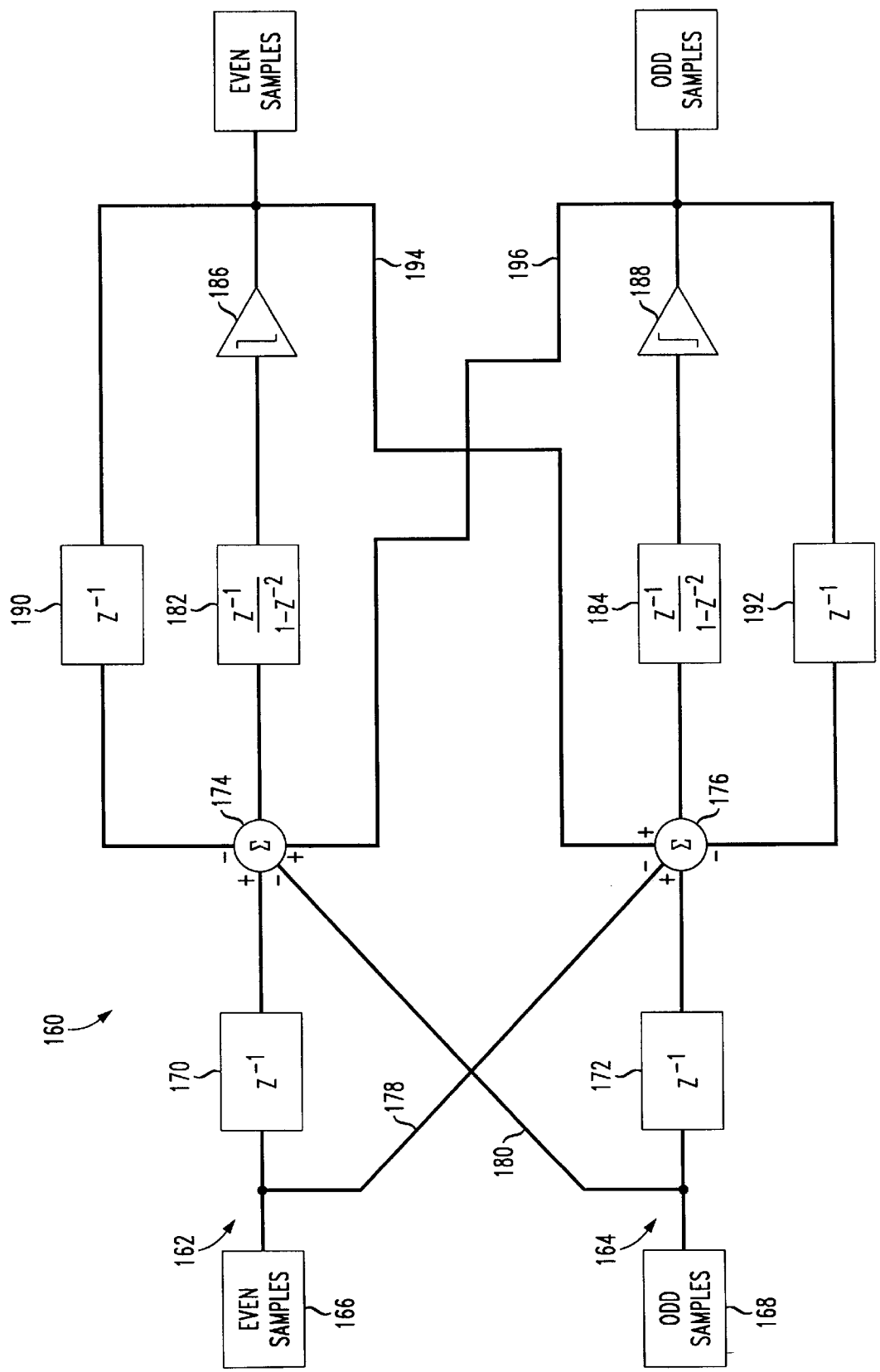
FIG. 15 is a signal diagram of a further embodiment of the present invention similar to the embodiment of FIG. 6 and suitable for use with a switched capacitor integrator.

Referring now to FIG. 15, a variation of the present invention comprises a second order bandpass sigma-delta modulator 160 suitable for implementation in a switched capacitor circuit. An important consideration that provides additional advantages for the present invention involves including the inherent phase delay of the switched capacitor integrator into the modulator network. This may be effected by holding the even and odd samples at the input as well as those at the output of the comparator for an entire cycle. Similarly, the even and odd samples are staggered by half a clock cycle. It should be understood that the term "cycle" refers to the duration between two consecutive even samples (or odd samples). In this case, a delay of one cycle is $Z^{-2}$ in the z-domain, and a delay of half a cycle is $Z^{-1}$.

Further referring to FIG. 15, the modified single channel second order bandpass SDM includes mutually crosscoupled even and odd sample branches 162 and 164. The branches include respective even and odd sample and hold circuits 166 and 168 that are delayed by half a cycle at 170 and 172. The delayed signals are fed to the respective inputs of first and second adders 174 and 176. The adders include inputs for receiving the sampled analog signal, a feedback quantization signal, and respective positive and negative cross-coupled signals from respective pairs of cross coupled connections 178 and 180, and 194 and 196. The respective outputs of the first and second adders are directed to respective integrators 182 and 184 having transfer characteristics approximating:

$$\frac{Z^{-1}}{1-Z^{-2}}$$

which take into account the inherent delay using the switched capacitor construction. Respective quantizers 186 and 188 receive the outputs of the integrators and produce quantized representations of the integrated signals to be fed back through respective delay elements 190 and 192 to the respective adders 174 and 176, with cross-coupled feedback directed to the other of the adders via circuit paths 194 and 196.

Figure 16:
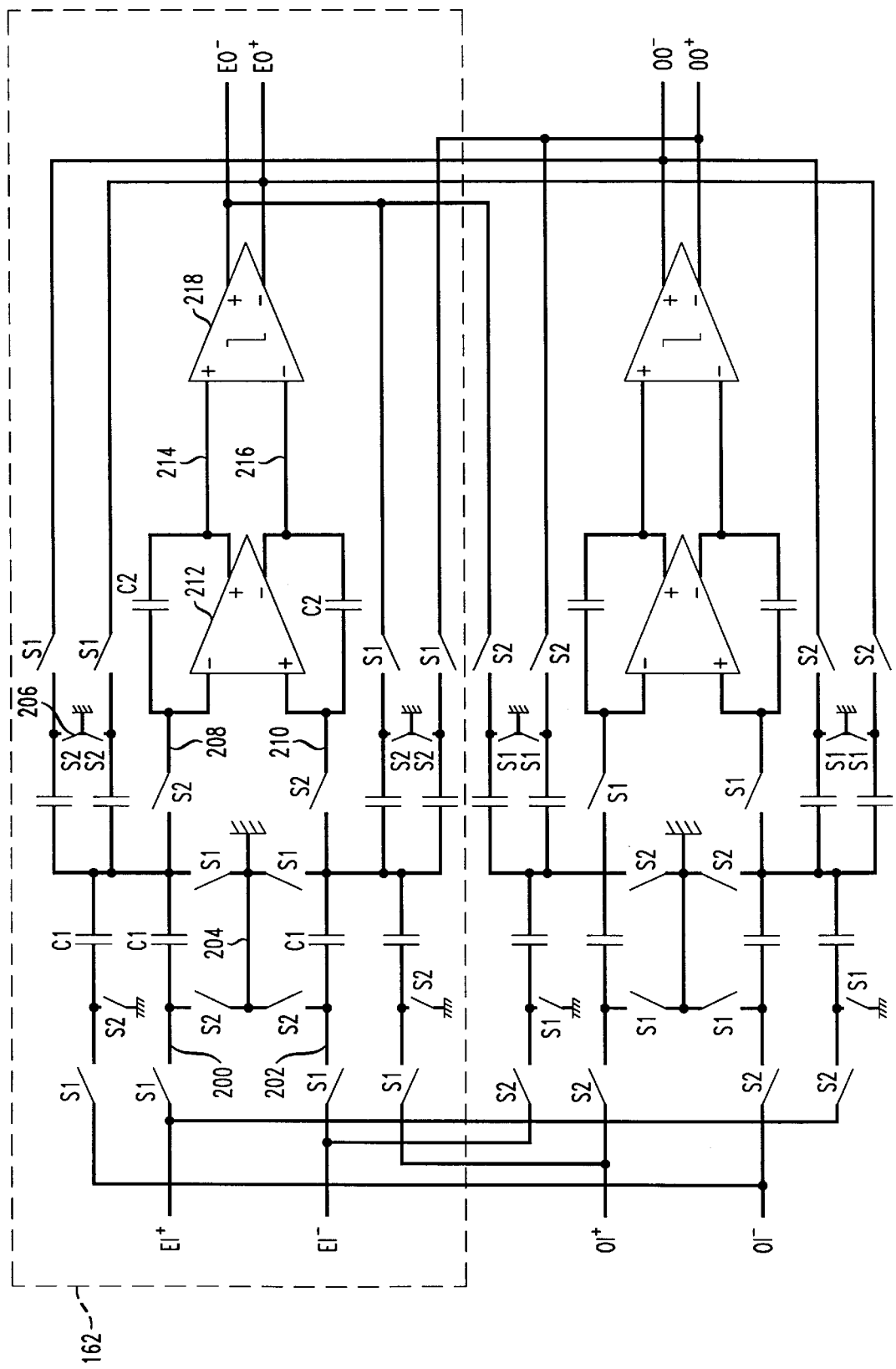
FIG. 16 is a schematic of a switched capacitor implementation of the signal diagram of FIG. 15.

FIG. 16 illustrates the configuration described above realized in an actual switched capacitor implementation. For clarity, operation of the circuit in only the even sample branch 162 will be described, keeping in mind that the rest of the circuit operates in similar fashion. With the timing of closure for switches S1 and S2 respectively defined by the dual phase clock illustrated in FIG. 14, detection of $\Phi_1$ causes switches S1 to complete respective input circuit paths 200 and 202 for analog signals emanating from even sample inputs E1+ and E1−. During the half cycle of the clock phase, capacitors, C1 charge up to the value of the sampled signal. Upon detection Of $\Phi_2$, switches S1 open while switches S2 close to complete ground paths 204 and 206 in addition to completing paths 208 and 210. With the completion of the paths, the capacitors C1 discharge through capacitors C2 such that the op amp 212 realizes the integrator transfer function:

$$\frac{Z^{-1}}{1-Z^{-2}}$$

The outputs 214 and 216 of the op amp 212 are fed to the inputs of a second op amp 218 configured as a comparator to quantize the signal. The quantized outputs are then fed back as feedback signals to the respective first op amp inputs (acting as an adder) and as a cross-coupled signal to the input of the other first op amp of the odd sample branch 164. The negative output is taken care of by having EO⁻ as the top branch, and EO⁺ on the bottom branch.

Those skilled in the art will appreciate the dual functionality of the operational amplifiers as both an adder and an integrator which correspondingly reduces the number of op amps required for implementation in the chip. This feature is extremely invaluable in high density integrated circuit design where component compactness is of utmost importance.

Figure 17:
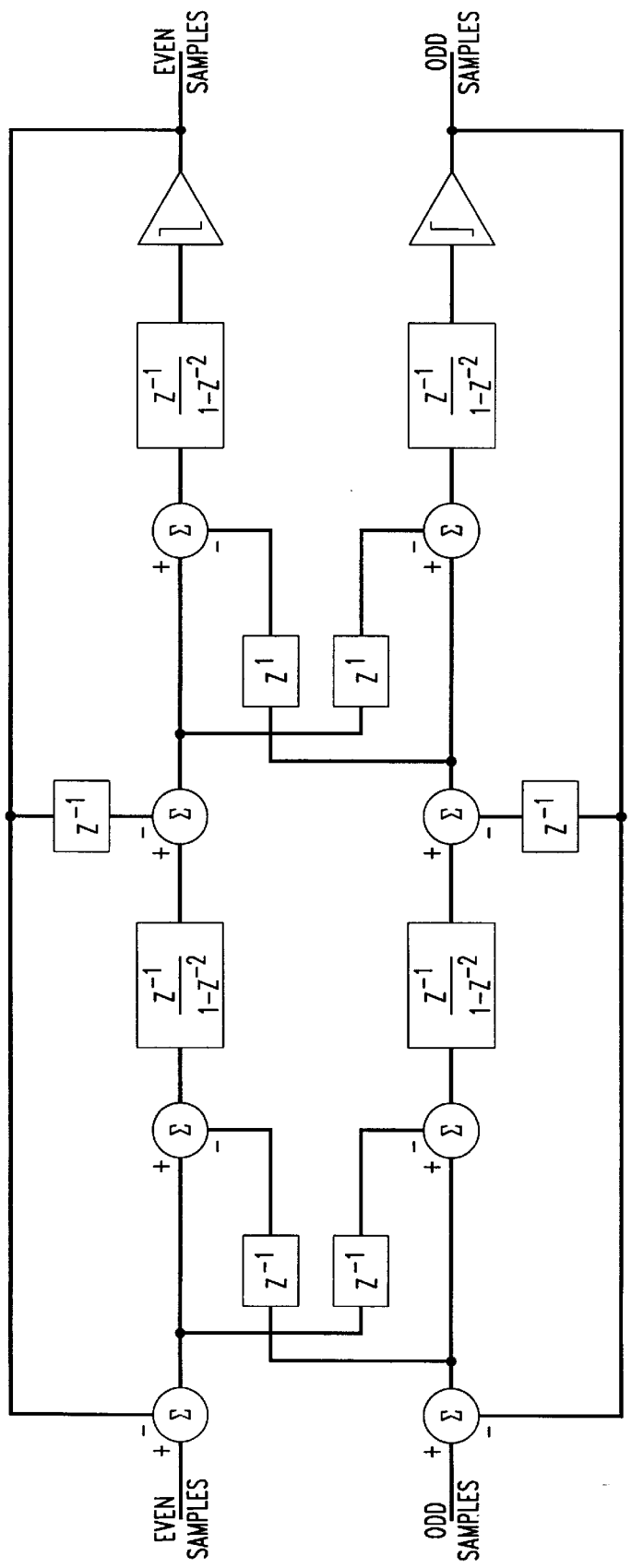
FIG. 17 is a signal diagram of a still further embodiment of the present invention similar to the embodiment of FIG. 12.

In a variation of the circuit implementation described above in FIG. 12, and illustrated in FIG. 17, a single channel fourth order bandpass SDM may be realized by cascading two second order SDMs, similar to the arrangement described in FIG. 12. Those skilled in the art will note that this embodiment of FIG. 17 includes non-causal blocks 168 and 170.

Figure 18:
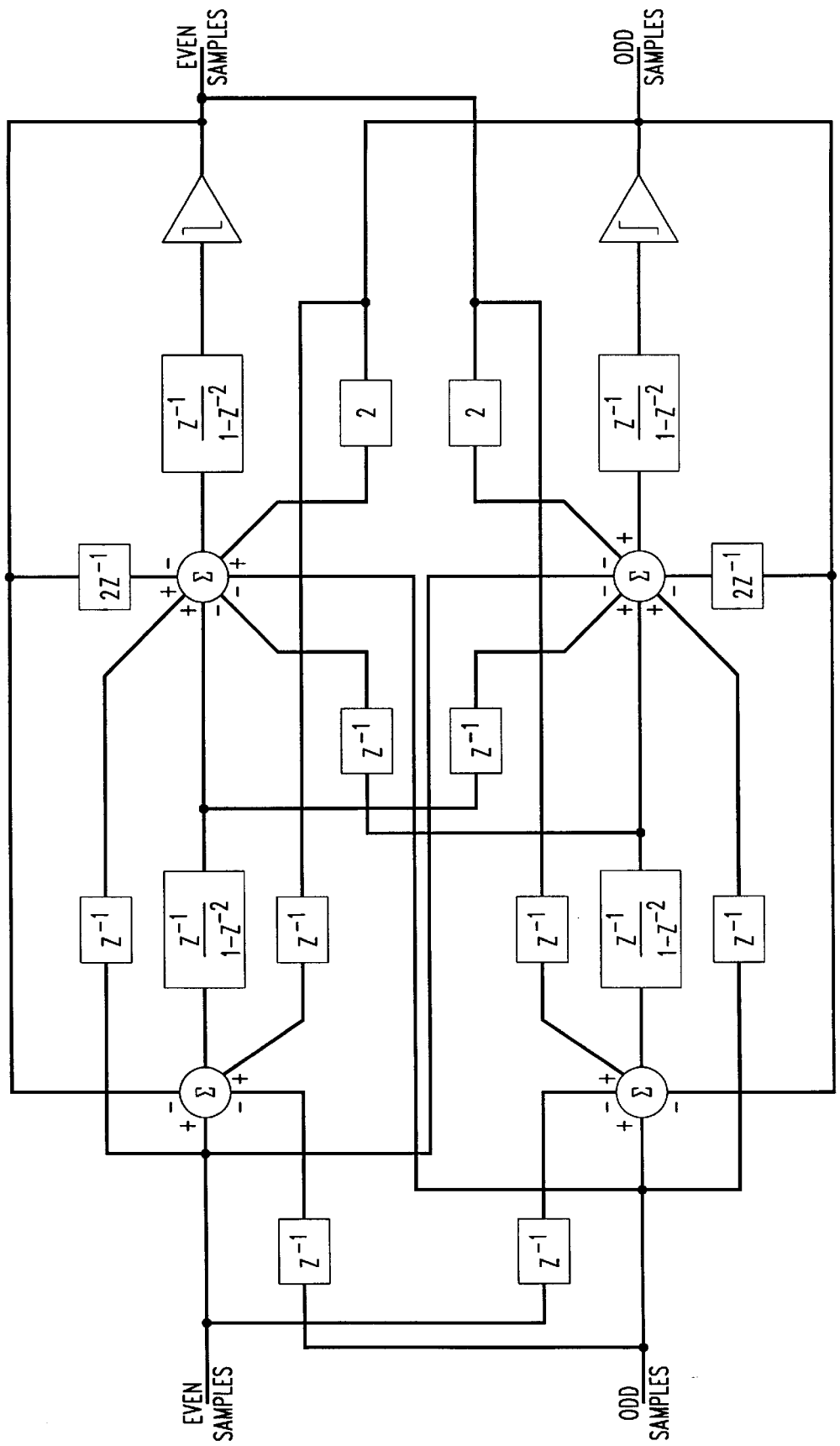
FIG. 18 is a signal diagram of another embodiment of the present invention similar to the embodiment of FIG. 12 and suitable for use in a switched capacitor application.
Figure 19:
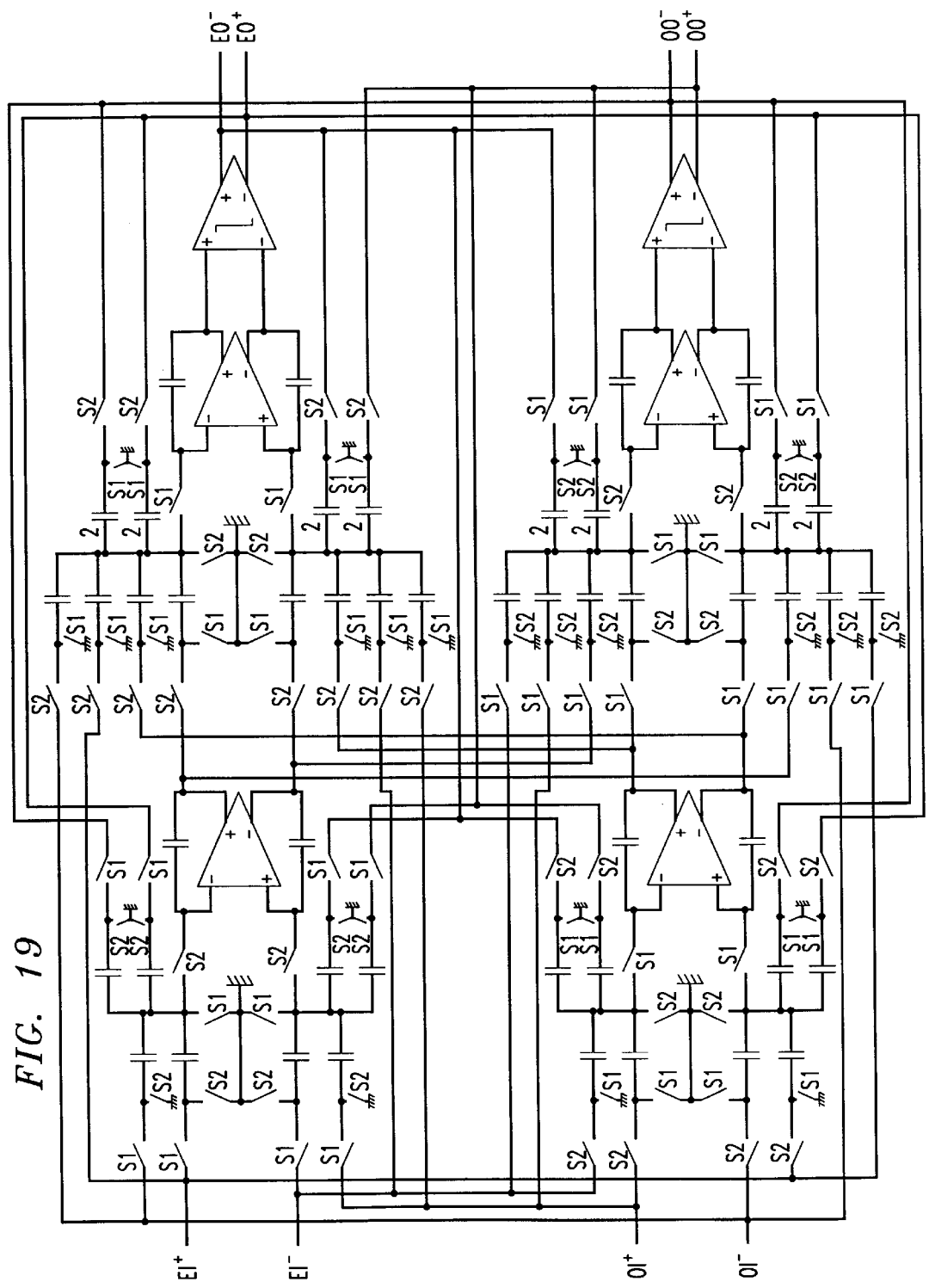
FIG. 19 is a schematic of a switched capacitor implementation of the signal diagram of FIG. 18.

To retain the causality of each block, I have found it possible to manipulate the blocks as shown in FIG. 18, and construct the circuit to require only four operational amplifiers. Like the embodiment of FIG. 15, the delays are obtained through the application of the switched capacitor dual phase clock. FIG. 19 illustrates the actual switched capacitor implementation for the embodiment of FIG. 18.

Constructing the aforedescribed bandpass SDM's utilizing switched capacitor technology may be accomplished through any of the widely accepted microcircuit fabrication techniques. One particular application envisioned for the single channel bandpass SDM is for 0.5 μm 3.3 volt CMOS technology.

Those skilled in the art will appreciate the many benefits and advantages afforded by the present invention. Of significant importance is the feature that allows the capability of splitting the circuit into symmetrical parallel branches to relax the sampling speed requirements on the respective sample and hold circuits. As a corollary advantage, this allows current high speed sample and hold circuits to realize even faster overall performance through parallel implementation in the bandpass SDM of the present invention.

Moreover, while the present invention offers performance improvements in speed, instability problems are minimized through symmetrical implementation of the cross-coupling connections. These connections serve to mutually couple and correlate the individual branches to cooperatively produce overall transfer functions that provide a relatively high dynamic range of operability and resolution. Stability has also been improved in the single channel second order and fourth order bandpass SDM by placing the integrator block after the subtractor. This is extendable to any higher order implementation.

A further advantage of the present invention is its adaptability for implementation in a switched-capacitor environment. Switched capacitor technology makes feasible the inclusion of the present invention in high density integrated circuit packages. The present invention also includes the feature, when implemented in a switched capacitor circuit, to utilize the same operational amplifier for integration and addition (subtraction), thus reducing the number of operational amplifiers required to implement the modulators. This not only frees up space on the integrated circuit for additional devices, but also minimizes the number of components that could potentially cause mismatch effects in the circuit.

While the invention has been particularly shown and described with reference to the preferred embodiments thereof,, it will be understood by those skilled in the art that various changes in form and detail may be made therein without departing from the spirit and scope of the invention.

What is claimed is:

1. A single channel bandpass sigma-delta modulator having an overall bandpass transfer function and an overall sampling rate $f_s$ for converting bandpass analog signals into digital signals, said modulator including:

a first low pass sigma-delta modulator of a predetermined order and operative according to a predetermined transfer characteristic for producing a first output of an initial dynamic range;

a second low pass sigma-delta modulator substantially similar to said first low pass sigma-delta modulator and disposed in parallel relationship with said first modulator; and cross-coupled connections between said first and second modulators to alter said respective transfer characteristics such that said first and second low pass modulator outputs cooperate to form said bandpass transfer function and expand said dynamic range beyond said initial dynamic range.

2. A single channel bandpass sigma-delta modulator according to claim 1 wherein:

said first and second modulators are configured substantially symmetrical to minimize component mismatching.

3. A single channel bandpass sigma-delta modulator according to claim 1 wherein:

said first modulator comprises an even sample low pass sigma delta modulator having a first sample and hold circuit triggered by said even samples; and said second modulator comprises an odd sample low pass sigma delta modulator having a second sample and hold circuit triggered by said odd samples;

whereby said sample and hold circuits operate at a sampling rate of:

$$\frac{f_s}{2}$$

4. A single channel bandpass sigma-delta modulator according to claim 1 wherein said first low pass sigma delta modulator comprises a forward path having:

a first sample and hold circuit for triggering on even samples from said input analog signal;

a first subtractor to receive said even sampled analog signal;

an integrator having a low pass transfer characteristic;

a first delay element disposed in a cascade relationship with said integrator to define a first transfer characteristic;

a second subtractor coupled to the output of said delay element and having an input to receive a cross-coupled signal from said second low pass modulator; and a second delay element cross-coupled to said second low pass modulator.

5. A single channel bandpass sigma-delta modulator according to claim 4 wherein:

said integrator transfer characteristic comprises:

$$\frac{1}{1-Z^{-2}}$$

6. A single channel bandpass sigma-delta modulator according to claim 4 wherein:

said integrator is disposed at the output of said first subtractor; and said first delay element is directly connected to the output of said integrator.

7. A single channel bandpass sigma-delta modulator according to claim 4 wherein:

said first delay element is disposed at the output of said first subtractor; and said integrator is connected to the output of said second subtractor.

8. A dual channel bandpass sigma-delta modulator having an overall bandpass transfer function and an overall sampling rate $2f_s$ for converting bandpass analog signals to digital signals, said modulator including:

an in-phase channel for processing in-phase signals and comprising a single channel bandpass sigma-delta modulator operating at a sampling rate of $f_s$ and having a channel transfer function, said in-phase channel having:

a first low pass sigma-delta modulator of a predetermined order and operative according to a predetermined transfer characteristic for producing a first output of an initial dynamic range;

a second low pass sigma-delta modulator substantially similar to said first low pass sigma-delta modulator and disposed in parallel relationship with said first modulator;

cross-coupling connections disposed between said first and second modulators to alter said respective transfer characteristics such that said first and second low pass modulator outputs cooperate to define said channel transfer function and expand said dynamic range beyond said initial dynamic range; and a quadrature phase channel disposed in parallel relationship with said in-phase channel and configured substantially similar to said in-phase channel for processing quadrature phase bandpass signals.

9. A dual channel bandpass sigma-delta modulator according to claim 8 wherein:

said first and second modulators are configured substantially symmetrical to minimize component mismatching.

10. A dual channel bandpass sigma-delta modulator according to claim 8 wherein:

said first modulator comprises an even sample low pass sigma delta modulator having a first sample and hold circuit triggered by said even samples; and said second modulator comprises an odd sample low pass sigma delta modulator having a second sample and hold circuit triggered by said odd samples;

whereby said sample and hold circuits operate at a sampling rate of:

$$\frac{f_s}{2}$$

11. A dual channel bandpass sigma-delta modulator according to claim 8 wherein said first low pass sigma delta modulator comprises a forward path having:

a first sample and hold circuit for triggering on even samples from said input analog signal;

a first subtractor to receive said even sampled analog signal;

an integrator having a low pass transfer characteristic;

a first delay element disposed in a cascade relationship with said integrator to define a first transfer characteristic;

a second subtractor coupled to the output of said low pass filter and having an input to receive a cross-coupled signal from said second low pass modulator; and a second delay element cross-coupled to said second low pass modulator.

12. A dual channel bandpass sigma-delta modulator according to claim 11 wherein:

said integrator transfer characteristic comprises approximately:

$$\frac{1}{1-Z^{-2}}$$

13. A dual channel bandpass sigma-delta modulator according to claim 11 wherein:

said integrator is disposed at the output of said first subtractor; and said first delay element is directly connected to the output of said integrator.

14. A dual channel bandpass sigma-delta modulator according to claim 11 wherein:

said first delay element is disposed at the output of said first subtractor; and said integrator is connected to the output of said second subtractor.

15. A dual channel bandpass sigma-delta modulator according to claim 8 wherein:

said overall bandpass transfer function is characterized as a second order transfer function.

16. A dual channel bandpass sigma-delta modulator according to claim 8 wherein:

said overall bandpass transfer function is characterized as a fourth order transfer function.

17. A fourth order single channel bandpass sigma-delta modulator for use with an integrated circuit switched capacitor network to convert bandpass analog signals to digital signals, said modulator including:

an input stage for receiving said analog signals, said input stage including respective even sample and odd sample low pass forward paths, said paths mutually cross coupled through respective delay elements and having respective input second order transfer characteristics; and an output stage cascaded with said input stage and comprising:
  a first low pass second order sigma-delta modulator operative according to a predetermined transfer function for cooperating with said input second order transfer characteristic to produce a first output of an initial dynamic range;
  a second low pass second order sigma-delta modulator substantially similar to said first low pass sigma-delta modulator and disposed in parallel relationship with said first modulator; and
  cross-coupled connections disposed between said first and second modulators to alter said respective transfer characteristics such that said first and second low pass modulator outputs cooperate to form said bandpass transfer function and expand said dynamic range beyond said initial dynamic range.

18. A method of expanding the dynamic range of a bandpass sigma-delta modulator comprising at least one pair of low pass sigma-delta modulators disposed in parallel relation, said pair of modulators having substantially similar transfer characteristics to cooperatively define an output transfer function defining an initial dynamic range, said method including the step of:
  cross-coupling said low pass sigma-delta modulators to alter said output transfer function and cooperatively expand said initial dynamic range.

19. A method of modulating a sampled analog signal with a bandpass sigma-delta modulator having respective subtractor, integrator and delay elements for implementation in an integrated circuit switched capacitor network driven by a dual phase clock to reduce the number of devices in said integrated circuit, said method including the steps of:
  selecting a timing scheme to realize respective switching delays in said switched capacitor network;
  substituting said switching delays from said dual phase clock for the delays associated with said delay elements to carry out said delay function without implementing said delay elements on said integrated circuit.

20. A method according to claim 19 and further including the step of:
  utilizing a single operational amplifier to comprise said respective subtractors and integrators.

21. In a second order single channel bandpass sigma-delta modulator for converting bandpass analog signals to digital signals, said modulator having respective even and odd sample branches, said branches including respective positive and negative signal paths, said paths including:
  an input node for collecting a plurality of input signals for subtraction into a resultant signal;
  a switched capacitor integrator having an input coupled to said input node, said switched capacitor integrator including respective pairs of switches respectively disposed in a ladder network and cooperating with a plurality of capacitors to effect delay changes in signal transmission through sequencing of a multi-phase clock, and an amplifier having an input terminal connected to said ladder network and including a capacitive feedback loop shunted across the input and the output of said amplifier; and
  a comparator disposed at the output of said integrator, said comparator comprising an amplifier and including an output fed back to the input of said integrator and cross-coupled to an oppositely sampled branch input.

22. In a fourth order single channel bandpass sigma-delta modulator for converting bandpass analog signals to digital signals, said modulator having respective even and odd sample branches, said branches including respective positive and negative signal paths, said paths including:
  a first stage comprising
    an input node for collecting a plurality of signals for subtraction into a resultant signal,
    a first switched capacitor integrator having an input coupled to said input node, said switched capacitor integrator including respective pairs of switches respectively disposed in a ladder network and cooperating with a plurality of capacitors to effect delay changes in signal transmission through sequencing of a multi-phase clock, and an amplifier having an input terminal connected to said ladder network and including a capacitive feedback loop shunted across the input and the output of said amplifier; and
  a second stage disposed at the output of said first stage and including
    an intermediate node for collecting said first integrator output signal and combining said output signal with a plurality of intermediate signals,
    a second switched capacitor integrator having an input connected to said intermediate node and constructed substantially similar to said first switched capacitor integrator, and
    a comparator disposed at the output of said second switched capacitor integrator, said comparator comprising an amplifier and including an output fed back to the input of said second integrator and cross-coupled to an oppositely sampled branch input.

* * * * *